(12) United States Patent  
Dayeh et al.

(10) Patent No.: US 12,065,745 B2  
(45) Date of Patent: Aug. 20, 2024

(54) POROUS PLATINUM NANOROD ELECTRODE ARRAY FLEXIBLE SENSOR DEVICES AND FABRICATION

(71) Applicant: The Regents of the University of California, Oakland, CA (US)

(72) Inventors: Shadi A. Dayeh, San Diego, CA (US); Mehran Ganji, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 563 days.

(21) Appl. No.: 17/291,236

(22) PCT Filed: Nov. 7, 2019

(86) PCT No.: PCT/US2019/060230  
§ 371 (c)(1),  
(2) Date: May 4, 2021

(87) PCT Pub. No.: WO2020/097305  
PCT Pub. Date: May 14, 2020

(65) Prior Publication Data  
US 2021/0371987 A1 Dec. 2, 2021

Related U.S. Application Data

(60) Provisional application No. 62/757,264, filed on Nov. 8, 2018.

(51) Int. Cl.  
*C23F 1/02* (2006.01)  
*C22C 5/04* (2006.01)  
(Continued)

(52) U.S. Cl.  
CPC .................. *C23F 1/02* (2013.01); *C22C 5/04* (2013.01); *C23C 14/16* (2013.01); *C23C 14/5873* (2013.01); *G06F 3/015* (2013.01)

(58) Field of Classification Search  
CPC ......... C22C 5/04; C23C 14/228; C23C 14/34; C23C 14/5873; C23F 1/02; A61L 31/14;  
(Continued)

(56) References Cited

U.S. PATENT DOCUMENTS 6,974,533 B2 12/2005 Zhou  
7,706,893 B2 4/2010 Hung et al.  
(Continued)

FOREIGN PATENT DOCUMENTS

CN 103303861 B 4/2017

OTHER PUBLICATIONS

Ganji et al.(Development and Translation of PEDOT: PSS Microelectrodes for Intraoperative Monitoring), Advanced Functional Materials, Published May 12, 2017, from pp. 1-11.*  
(Continued)

*Primary Examiner* — Ali Naraghi  
*Assistant Examiner* — E. Rhett Cheek  
(74) *Attorney, Agent, or Firm* — Greer, Burns & Crain, Ltd.; Steven P. Fallon

(57) ABSTRACT

A method for fabricating a Pt nanorod electrode array sensor device includes forming planar metal electrodes on a flexible film, co-depositing Pt alloy on the planar metal electrodes via physical vapor deposition, and dealloying the Pt alloy to etch Pt nanorods from the deposited Pt alloy. A Pt nanorod electrode sensor device includes a plurality of porous Pt nanorods on a planar metal electrode forming a sensor electrode. The planar metal electrode is on a flexible substrate. An electrode lead on the flexible substrate extends away from the planar metal electrode. Insulation is around porous Pt nanorods an upon the electrode lead.

8 Claims, 5 Drawing Sheets

(51) Int. Cl.
    C23C 14/16      (2006.01)
    C23C 14/58      (2006.01)
    G06F 3/01       (2006.01)
(58) Field of Classification Search
    CPC .... A61L 31/022; A61N 1/0541; A61N 1/0551
    See application file for complete search history.

(56) References Cited

U.S. PATENT DOCUMENTS

| | | | |
|---|---|---|---|
| 2007/0275499 A1* | 11/2007 | Corderman | H10K 71/191 |
| | | | 438/132 |
| 2010/0193365 A1 | 8/2010 | Lopatin et al. | |
| 2013/0084569 A1* | 4/2013 | Wang | B01D 61/00 |
| | | | 977/773 |
| 2014/0336739 A1 | 11/2014 | Lotfi et al. | |
| 2017/0231518 A1* | 8/2017 | Dayeh | B81C 1/00111 |
| | | | 600/544 |
| 2021/0370053 A1* | 12/2021 | Jin | A61N 1/0556 |

OTHER PUBLICATIONS

Ganji et al., "Selective Formation of Porous Pt Nanorods for Highly Electrochemically Efficient Neural Electrode Interfaces", Nano Letters, 2019, pp. 6244-6254, vol. 19, No. 9, ACS Publications.

Kloke et al., "Strategies for the Fabrication of Porous Platinum Electrodes", Advanced Materials, 2011, pp. 4976-5008, vol. 23, WILEY-VCH Verlag GmbH & Co. KGaA, Weinheim.

Ganji et al., "Monolithic and Scalable Au Nanorod Substrates Improve PEDOT-Metal Adhesion and Stability in Neural Electrodes", Advanced Healthcare Materials, 2018, pp. 1-23, vol. 7, No. 22, WILEY-VCH Verlag GmbH & Co. KGaA, Weinheim.

Gan et al., "Nanoporous metals processed by dealloying and their applications", AIMS Materials Science, 2018, pp. 1141-1183, vol. 5, No. 6, AIMS Press.

International Search Report and Written Opinion from the corresponding International Patent Application No. PCT/JS2019/060230, dated Jan. 10, 2020.

Desai et al., "Improving impedance of implantable microwire multi-electrode arrays by ultrasonic electroplating of durable platinum black", Frontiers in Neuroengineering, 2010, pp. 1-11, vol. 3, Art. 5, Frontiers Media SA.

Cogan, "Neural Stimulation and Recording Electrodes", Annual Review of Biomedical Engineering, 2008, pp. 275-309, vol. 10, Annual Reviews.

Boehler et al., "Nanostructured platinum grass enables superior impedance reduction for neural microelectrodes", Biomaterials, 2015, pp. 346-353, vol. 67, Elsevier Ltd.

Erlebacher et al., "Evolution of nanoporosity in dealloying", Nature, 2001, pp. 450-453, vol. 410, Macmillan Magazines Ltd.

Ludwig et al., "PEDOT polymer coatings facilitate smaller neural recording electrodes", Journal of Neural Engineering, 2011, pp. 1-14, vol. 8, No. 1, National Institutes of Health.

Venkatraman et al., "In Vitro and In Vivo Evaluation of PEDOT Microelectrodes for Neural Stimulation and Recording", IEEE Transactions on Neural Systems and Rehabilitation Engineering, 2011, pp. 307-316, vol. 19, No. 3, IEEE.

Yang et al., "Ordered surfactant-templated poly(3,4-ethylenedioxythiophene) (PEDOT) conducting polymer on microfabricated neural probes", Acta Biomaterialia, 2005, pp. 125-136, vol. 1, Elsevier Ltd.

Ganji et al., "Scaling Effects on the Electrochemical Stimulation Performance of Au, Pt, and PEDOT:PSS Electrocorticography Arrays", Advanced Functional Materials, 2017, pp. 1-14, vol. 27, No. 1703019, WILEY-VCH Verlag GmbH & Co. KGaA, Weinheim.

Kumsa et al., "Electron transfer processes occurring on platinum neural stimulating electrodes: pulsing experiments for cathodic-first, charge-imbalanced, biphasic pulses for $0.566 \leq k \leq 2.3$ in rat subcutaneous tissus", Journal of Neural Engineering, 2019, pp. 1-11, vol. 16, No. 026018, IOP Publishing.

Beebe et al., "Charge Injection Limits of Activated Iridium Oxide Electrodes with 0.2 ms Pulses in Bicarbonate Buffered Saline", IEEE Transactions on Biomedical Engineering, 1988, pp. 494-498, vol. 35, No. 6, IEEE.

Cogan et al., "Potential-Biased, Asymmetric Waveforms for Charge-Injection With Activated Iridium Oxide (AIROF) Neural Stimulation Electrodes", IEEE Transactions on Biomedical Engineering, 2006, pp. 327-332, vol. 53, No. 2, IEEE.

Cogan et al., "Sputtered iridium oxide films (SIROFs) for low-impedance neural stimulation and recording electrodes", Proceedings of the 26th Annual International Conference of the IEEE EMBS, 2004, pp. 4153-4156, IEEE.

Li et al., "Electrochemical Synthesis of One-Dimensional Mesoporous Pt Nanorods Using the Assembly of Surfactant Micelles in Confined Space", Angewandte Chemie International Edition, 2013, pp. 8050-8053, vol. 52, WILEY-VCH Verlag GmbH & Co. KGaA, Weinheim.

Liu et al., "Nanoporous Pt-Co Alloy Nanowires: Fabrication, Characterization, and Electrocatalytic Properties", Nano Letters, 2009, pp. 4352-4358, vol. 9, No. 12, American Chemical Society.

Lee et al., "Biofunctionalization of Nerve Interface via Biocompatible Polymer-Roughened Pt Black on Cuff Electrode for Chronic Recording", Advanced Healthcare Materials, 2017, pp. 1-12, vol. 6, No. 1601022, WILEY-VCH Verlag GmbH & Co. KGaA, Weinheim.

Li et al., "Synthesis and characterization of nanoporous Pt-Ni alloys", Applied Physics Letters, 2009, pp. 1-3, vol. 95, No. 201902, American Institute of Physics.

Liu et al., "Microstructure, electrocatalytic and sensing properties of nanoporous Pt46Ni54 alloy nanowires fabricated by mild dealloying", Journal of Materials Chemistry, 2010, pp. 5621-5627, vol. 20, The Royal Society of Chemistry.

Shui et al., "Making Pt-shell Pt30Ni70 nanowires by mild dealloying and heat treatments with little Ni loss", Journal of Materials Chemistry, 2011, pp. 6225-6229, vol. 21, The Royal Society of Chemistry.

Jin et al., "Nanoporous Au-Pt Alloys as Large Strain Electrochemical Actuators", Nano Letters, 2010, pp. 187-194, vol. 10, American Chemical Society.

Tominaka et al., "Mesoporous PdCo sponge-like nanostructure synthesized by electrodeposition and dealloying for oxygen reduction reaction", Journal of Materials Chemistry, 2010, pp. 7175-7182, vol. 20, The Royal Society of Chemistry.

Zhang et al., "Generalized Fabrication of Nanoporous Metals (Au, Pd, Pt, Ag, and Cu) through Chemical Dealloying", The Journal of Physical Chemistry C, 2009, p. 12629-12636, vol. 113, American Chemical Society.

Liang et al., A Free-Standing Pt-Nanowire Membrane as a Highly Stable Electrocatalyst for the Oxygen Reduction Reaction, Advanced Materials, 2011, pp. 1467-1471, vol. 23, WILEY-VCH Verlag GmbH & Co. KGaA, Weinheim.

Qiang et al., "Highly sensitive and reusable Pt-black microfluidic electrodes for long-term electrochemical sensing", Biosensors and Bioelectronics, 2010, pp. 682-688, vol. 26, Elsevier B.V.

* cited by examiner

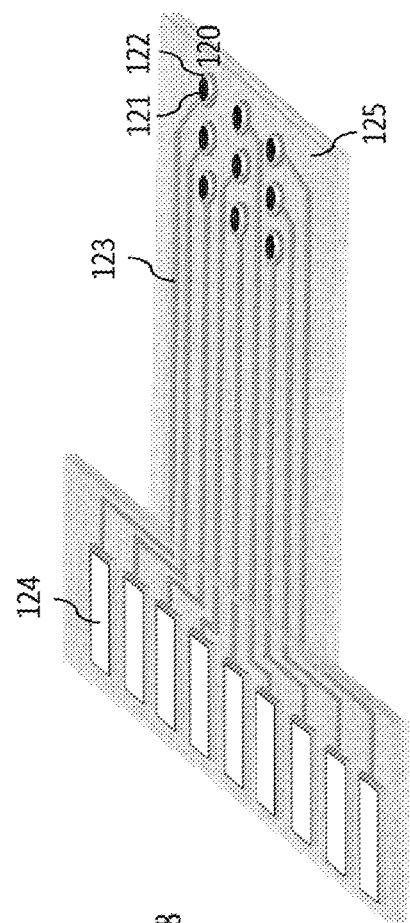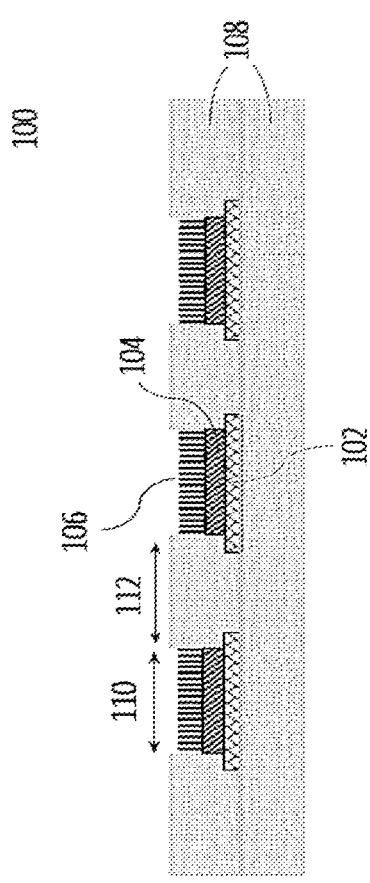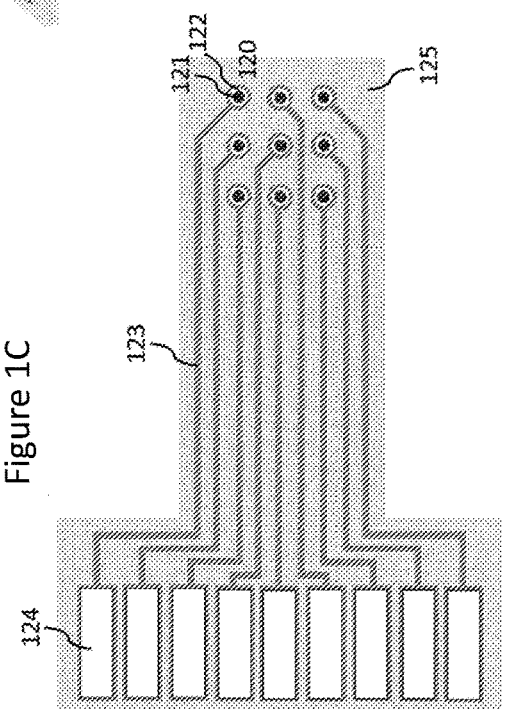
Figure 1A
Figure 1B
Figure 1C

POROUS PLATINUM NANOROD ELECTRODE ARRAY FLEXIBLE SENSOR DEVICES AND FABRICATION

PRIORITY CLAIM AND REFERENCE TO RELATED APPLICATION

The application claims priority under 35 U.S.C. § 119 and all applicable statutes and treaties from prior U.S. provisional application Ser. No. 62/757,264, which was filed Nov. 8, 2018.

STATEMENT OF GOVERNMENT INTEREST

This invention was made with government support under grant number 1743694 awarded by the National Science Foundation. The government has certain rights in the invention.

FIELD

Fields of the invention include electrochemical sensing and arrays of nanosized conductive sensors. Example applications of the invention include implants for brain-machine interfaces, for functional mapping during neurosurgical resection of diseased tissue in patients with brain tumors or epilepsy, for closed loop neuromodulation devices in brain implants, for spinal and peripheral nerve implants, and a variety of other electrophysiology and electrochemical sensors that can generally interface with human tissue.

BACKGROUND

Traditional biologically inert noble metals such as Pt, Ir or IrPt—have been the materials of choice for manufacturing nerve electrodes/biomedical devices in clinical-relevant applications because of their biocompatibility and stability against corrosion, and because of their superior electrochemical properties compared to other material combinations. Despite these superior properties, the electrochemical interface impedance is not sufficiently low to enable recording of local minute potential fluctuations with low noise baseline—particularly when small size or small pitch are required—or to efficiently inject charges across the interface without building large voltages across the interface and therefore consuming larger powers per pulse. [Ref. 2(a), 4]. As a result, large electrodes are needed to compensate for this large impedance, but large electrodes compromise spatial resolution and specificity for recording and/or stimulation and limit the density and overall number of contacts. To increase the surface area and decrease the electrochemical impedance, nanostructures are often incorporated onto electrode surfaces to enhance their electrochemical properties. These nanostructures primarily increase the surface area of the electrode and also exhibit enhanced electrochemical interactions due to their rough surface morphology.

Prior work has successfully incorporated nanostructured Pt into electrodes, using electrochemical methods (electroplating)[Ref. 2(b), 5], but these electrodes suffered from poor structural integrity and physical strength due to incorporation of electrochemical surfactants at the interface between nanostructured Pt and the underlying electrode. Furthermore, common approaches for the fabrication of nanostructured Pt are generally not monolithic posing additional challenges for translation to clinical practice whereas some are also problematic due to the residual of toxic ligand additives remaining after Pt alloy electro-deposition. [Ref. 6].

Different methods have been reported to fabricate nanostructured Pt, mainly based on electrochemical deposition. Such approach involves electroplated Pt in polycarbonate (PC) membranes [Ref. 14], and in anodized aluminum oxide pores [Ref. 15], to form Pt nanostructures. Recently, different electro-deposited nanoporous Pt films, so-called "Pt-gray" [Ref. 2(b)], "nano-grass Pt" [Ref. 5(a)] and "polymer-roughened/BPt [Ref. 16], have been reported without involving secondary microstructures, to overcome the adhesion problem of traditional "Pt-black" at the cost of sacrificing the electrochemical gain [Ref. 3]. Also, the PtNP has been realized by de-alloying of co-electrodeposited Pt-based metal compounds that usually result in PtNi, [Ref. 17(a)], PtAu [Ref. 18] or PtCo [Ref. 17(c), 19] mainly for fuel cell applications. The de-alloying (wet etching) of electro-deposited alloy, have produced nanostructured Pt that contain either significant amount of toxic elements (Ni) and elements that form toxic isotopes during stimulation (Au), or elements that are electrochemically less active (Co). All of these electroplated structures are non-crystalline and mechanically fragile.

The same shortcomings apply for Pt bimetallic alloys [Ref. 5(b)] and nanoporous films of Pt [Ref. 20]. Furthermore, these prior electrochemical deposition strategies outlined above do not provide crystalline wires and exhibit weak metal-bonding [Ref. 21] (due to incorporation of electrochemical surfactants at the nanopores-underlying electrode) and thus show weak physical strength similar to that of Pt-black. They are also problematic due to the residual of toxic ligand additives remaining after alloy electro-deposition [Ref 2(a), 6].

The primary conventional electrochemical techniques for forming nanoporous Pt nanowires are conducted in solution. [Ref. 2]. These procedures can be referred to as bottom-up fabrication procedures. The structures produced generally suffer from mechanical stability issues or involve electrochemical surfactant or cytotoxic ligands. [Ref. 2a, 3].

REFERENCE LIST

1. Deng, Y.-J.; Tian, N.; Zhou, Z.-Y.; Huang, R.; Liu, Z.-L.; Xiao, J.; Sun, S.-G., Alloy tetrahexahedral Pd—Pt catalysts: enhancing significantly the catalytic activity by synergy effect of high-index facets and electronic structure. Chemical Science 2012, 3 (4), 1157-1161.
2. (a) Sinitsyna, O.; Paralikar, P.; Pandit, R.; Rai, M., Platinum in Biomedical Applications. In Biomedical Applications of Metals, Springer: 2018; pp 151-165; (b) Zhou, D. M., Platinum electrode and method for manufacturing the same. Google Patents: 2005.
3. Arcot Desai, S.; Rolston, J. D.; Guo, L.; Potter, S. M., Improving impedance of implantable microwire multielectrode arrays by ultrasonic electroplating of durable platinum black. Frontiers in neuroengineering 2010, 3, 5.
4. Cogan, S. F., Neural stimulation and recording electrodes. Annu. Rev. Biomed. Eng. 2008, 10, 275-309.
5. (a) Boehler, C.; Stieglitz, T.; Asplund, M., Nanostructured platinum grass enables superior impedance reduction for neural microelectrodes. Biomaterials 2015, 67, 346-353; (b) Farghaly, A. A.; Khan, R. K.; Collinson, M. M., Biofouling-Resistant Platinum Bimetallic Alloys. ACS applied materials & interfaces 2018.

6. Schuettler, M.; Doerge, T.; Wien, S.; Becker, S.; Staiger, A.; Hanauer, M.; Kammer, S.; Stieglitz, T., Cytotoxicity of platinum black. Proc. of FES Society 2005, 343-345.
7. Erlebacher, J.; Aziz, M. J.; Karma, A.; Dimitrov, N.; Sieradzki, K., Evolution of nanoporosity in dealloying. nature 2001, 410 (6827), 450.
8. (a) Berggren, M.; Richter-Dahlfors, A., Organic bioelectronics. Advanced Materials 2007, 19 (20), 3201-3213; (b) Ludwig, K. A.; Langhals, N. B.; Joseph, M. D.; Richardson-Burns, S. M.; Hendricks, J. L.; Kipke, D. R., Poly (3, 4-ethylenedioxythiophene)(PEDOT) polymer coatings facilitate smaller neural recording electrodes. Journal of neural engineering 2011, 8 (1), 014001; (c) Venkatraman, S.; Hendricks, J.; King, Z. A.; Sereno, A. J.; Richardson-Burns, S.; Martin, D.; Carmena, J. M., In vitro and in vivo evaluation of PEDOT microelectrodes for neural stimulation and recording. IEEE Transactions on Neural Systems and Rehabilitation Engineering 2011, 19 (3), 307-316; (d) Yang, J.; Kim, D. H.; Hendricks, J. L.; Leach, M.; Northey, R.; Martin, D. C., Ordered surfactant-templated poly (3, 4-ethylenedioxythiophene)(PEDOT) conducting polymer on microfabricated neural probes. Acta Biomaterialia 2005, 1 (1), 125-136; (e) Malliaras, G. G., Organic bioelectronics: a new era for organic electronics. Biochimica et Biophysica Acta (BBA)—General Subjects 2013, 1830 (9), 4286-4287; (f) Schwarz, J. A.; Contescu, C. I.; Putyera, K., Dekker encyclopedia of nanoscience and nanotechnology. CRC press: 2004; Vol. 3.
9. Ganji, M.; Tanaka, A.; Gilja, V.; Halgren, E.; Dayeh, S. A., Scaling Effects on the Electrochemical Stimulation Performance of Au, Pt, and PEDOT: PSS Electrocorticography Arrays. Advanced Functional Materials 2017.
10. Kumsa, D. W.; Bhadra, N.; Hudak, E. M.; Mortimer, J. T., Electron transfer processes occurring on platinum neural stimulating electrodes: pulsing experiments for cathodic-first, charge-balanced, biphasic pulses for $0.566<=k<=2.3$ in rat subcutaneous tissues. Journal of Neural Engineering 2017, 14 (5).
11. (a) Beebe, X.; Rose, T., Charge injection limits of activated iridium oxide electrodes with 0.2 ms pulses in bicarbonate buffered saline (neurological stimulation application). IEEE transactions on biomedical engineering 1988, 35 (6), 494-495; (b) Cogan, S. F.; Troyk, P. R.; Ehrlich, J.; Plante, T. D.; Detlefsen, D. E., Potential-biased, asymmetric waveforms for charge-injection with activated iridium oxide (AIROF) neural stimulation electrodes. IEEE Transactions on Biomedical Engineering 2006, 53 (2), 327-332.
12. Cogan, S. F.; Plante, T.; Ehrlich, J. In Sputtered iridium oxide films (SIROFs) for low-impedance neural stimulation and recording electrodes, Engineering in Medicine and Biology Society, 2004. IEMBS'04. 26th Annual International Conference of the IEEE, IEEE: 2004; pp 4153-4156.
13. (a) Kuncel, A. M.; Grill, W. M., Selection of stimulus parameters for deep brain stimulation. Clinical neurophysiology 2004, 115 (11), 2431-2441; (b) Cogan, S. F.; Ludwig, K. A.; Welle, C. G.; Takmakov, P., Tissue damage thresholds during therapeutic electrical stimulation. Journal of neural engineering 2016, 13 (2), 021001.
14. Li, C.; Sato, T.; Yamauchi, Y., Electrochemical Synthesis of One-Dimensional Mesoporous Pt Nanorods Using the Assembly of Surfactant Micelles in Confined Space. Angewandte Chemie International Edition 2013, 52 (31), 8050-8053.
15. Liu, L.; Pippel, E.; Scholz, R.; Gösele, U., Nanoporous Pt—Co alloy nanowires: fabrication, characterization, and electrocatalytic properties. Nano letters 2009, 9 (12), 4352-4358.
16. Lee, Y. J.; Kim, H. J.; Kang, J. Y.; Do, S. H.; Lee, S. H., Biofunctionalization of Nerve Interface via Biocompatible Polymer-Roughened Pt Black on Cuff Electrode for Chronic Recording. Advanced healthcare materials 2017, 6 (6), 1601022.
17. (a) Li, H.; Misra, A.; Baldwin, J. K.; Picraux, S., Synthesis and characterization of nanoporous Pt—Ni alloys. Applied Physics Letters 2009, 95 (20), 201902; (b) Liu, L.; Scholz, R.; Pippel, E.; Gösele, U., Microstructure, electrocatalytic and sensing properties of nanoporous Pt46Ni54 alloy nanowires fabricated by mild dealloying. Journal of Materials Chemistry 2010, 20 (27), 5621-5627; (c) Shui, J.-L.; Zhang, J.-W.; Li, J. C., Making Pt-shell Pt 30 Ni 70 nanowires by mild dealloying and heat treatments with little Ni loss. Journal of Materials Chemistry 2011, 21 (17), 6225-6229.
18. Jin, H.-J.; Wang, X.-L.; Parida, S.; Wang, K.; Seo, M.; Weissmuller, J. r., Nanoporous Au—Pt alloys as large strain electrochemical actuators. Nano letters 2009, 10 (1), 187-194.
19. Tominaka, S.; Hayashi, T.; Nakamura, Y.; Osaka, T., Mesoporous PdCo sponge-like nanostructure synthesized by electrodeposition and dealloying for oxygen reduction reaction. Journal of Materials Chemistry 2010, 20 (34), 7175-7182.
20. Zhang, Z.; Wang, Y.; Qi, Z.; Zhang, W.; Qin, J.; Frenzel, J., Generalized fabrication of nanoporous metals (Au, Pd, Pt, Ag, and Cu) through chemical dealloying. The Journal of Physical Chemistry C 2009, 113 (29), 12629-12636.
21. (a) Liang, H. W.; Cao, X.; Zhou, F.; Cui, C. H.; Zhang, W. J.; Yu, S. H., A Free-Standing Pt-Nanowire Membrane as a Highly Stable Electrocatalyst for the Oxygen Reduction Reaction. Advanced Materials 2011, 23 (12), 1467-1471; (b) Qiang, L.; Vaddiraju, S.; Rusling, J. F.; Papadimitrakopoulos, F., Highly sensitive and reusable Pt-black microfluidic electrodes for long-term electrochemical sensing. Biosensors and Bioelectronics 2010, 26 (2), 682-688.

SUMMARY OF THE INVENTION

Preferred embodiments of the invention provide a method for fabricating a Pt nanorod electrode array sensor device that includes forming planar metal electrodes on a flexible film, co-depositing Pt alloy on the planar metal electrodes via physical vapor deposition, and dealloying the Pt alloy to etch Pt nanorods from the deposited Pt alloy. The other metal is one that can be selectively etched after deposition of the bimetal alloy. A preferred Pt alloy is PtAg. The metal planar metal electrodes can comprise Pt or the alloying metal, e.g. Ag.

A preferred Pt nanorod electrode sensor device includes a plurality of porous Pt nanorods on a planar metal electrode forming a sensor electrode. The planar metal electrode is on a flexible substrate. An electrode lead on the flexible substrate extends away from the planar metal electrode. Insulation is around porous Pt nanorods an upon the electrode lead. The Pt nanorods can be crystalline Pt. A preferred flexible substrate is parylene C, with a preferred thickness of ~2-20 μm.

BRIEF DESCRIPTION OF THE DRAWINGS

FIG. 1A is partial cross-sectional view of a preferred porous platinum electrode array of the invention; FIG. 1B and FIG. 1C are respective perspective and top-view views of the preferred electrode array sensor device;

DETAILED DESCRIPTION OF THE PREFERRED EMBODIMENTS

Figure 2A:
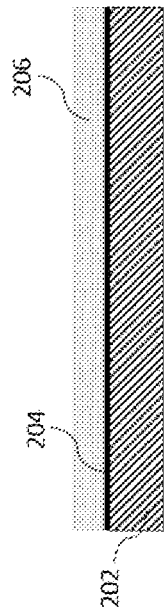
FIGS. 2A-2J illustrate preferred steps for fabrication of the electrode array of FIGS. 1A-1C.

A preferred fabrication method provides a monolithic and scalable fabrication process for production of a high-density and highly electrochemically active porous platinum nanorods (PtNRs). A 1-dimensional (1D) structure of PtNR film is created and enables high electrochemical activity (and therefore low electrochemical impedance). This is extremely important for applications that involve electrochemistry or catalysis and is also demonstrated through an experimental example as being important for recording and stimulating activity in central and peripheral nervous systems.

The nanorods in preferred arrays of the invention include a large effective surface area that is a function of the PtNR length (100 nm-10 μm), a porosity, and numerous edges that maximize electric fields and lower the metal work function for charge exchange between the PtNRs in liquid media, and promote record values of stimulation charge densities for PtNRs. For example, the nanorods in preferred arrays of the invention include a large effective surface area that is ~ 7X larger than that of a planar electrode for a 50 nm diameter nanorod having a 400 nm length. Unlike the bottom-up techniques discussed in the background, preferred embodiments provide a top-down technique to produce PtNRs using physical vapor deposition/sputtering and selective etching. The top-down approach produced PtNRs with excellent biocompatibility and stability. A PtNR array produced in experiments was verified under in-vivo cortical implant in a mouse's brain for 42 days.

A preferred fabrication method deposits tuned PtAg alloy. Ag can be selectively etched from the PtAg alloy, and other alloying metals that permit selective etching from a Pt/metal alloy can be used, i.e. another metal that is preferentially etched over Pt by an etchant. A selective chemical dissolution of Ag or another metal from PtAg alloy enables the integration of PtNR arrays and films on top of conventional Au and Pt leads using standard microfabrication techniques to build highly-stable PtNR based micro-electrode arrays.

PtNRs of the invention are capable of sensing, stimulating or inhibiting the neurological activities of the neurons, cardiomyocytes, nerve, muscle or any other excitable cells and tissue, via efficient electrochemical current exchange with surrounding tissue. Experiments demonstrated that the PtNRs create a sensor electrode having a charge injection capacity (CIC) of ~4.4 $mC/cm^2$, which is 16 times higher than that of control planar Pt films. The low impedance of the PtNR contacts (e.g., at 1 kHz 16.89±0.47 kΩ) allowed recording of local field potentials as well as action potentials (APs) of single neurons from the cortical surface. The recorded APs demonstrate the quality on par with that recorded from beneath the cortical surface—that is inside the brain tissue—using depth electrodes. The PtNRs microelectrode merits, such as high yield, high stability, low electrochemical impendence, high density, high sensitivity, high effective/geometric surface area (ESA/GSA) ratio, minimally destructive to brain tissue (thin layer placed on the cortical surface) and biocompatibility, etc., enable the PtNR microelectrodes to advance sensing to aid the next generation clinical neurotechnologies to be capable of recording and stimulation of spinal cord, cortical and peripheral nerve at ensemble or single cell activity resolution; in examples such as neuroprosthesis, pain management, pace makers, functional mapping, etc.

Preferred fabrication methods provide crystalline nanorods and strong metal bonding via wet chemical etching (de-alloying) of co-sputtered PtAg alloy-without involving electrochemical surfactant nor cytotoxic ligands—resulting in stable Pt nanorods (PtNRs); while integrated on conventional underlying Pt layers, with excellent electrochemical recording and stimulating capabilities and morphological characteristics and mechanical strength. Compared with existing electrocortigography (ECoG) electrodes, experimental arrays provide advances to enable the next generation of clinical ECoG micro-electrodes in recording/stimulating neurological applications.

Preferred methods provide for the formation of Pt nanorods (PtNRs)—with adjustable Nanorod height of a few tens of nanometers to a few micrometers, with a preferred height of 300-400 nm. An example process used chemical etching (de-alloying) of co-sputtered PtAg alloy (e.g., in 60 C° nitric acid), by selective dissolution of Ag from the PtAg alloy. The ratio of composition of Pt and Ag can be adjusted to provide a desired morphology. In an example experiment, Pt was deposited by DC sputtering and the Ag was co-deposited with RF sputtering; Decreasing the DC sputter power while reducing the weight fraction of Pt in the AgPt flow enabled facile dissolution of Ag from the top surface to result in nanorod like structures. Experiments provided a high yield of functional channels using standard neural probe manufacturing methods, for both in-vivo and in-vitro neural recording/stimulating applications.

Experiments demonstrated that the invention provides a scalable and monolithic integration method for the fabrication of high yield PtNR-based micro-electrode arrays with excellent electrochemical properties and that are built on an ultra-thin flexible parylene C substrates with minimal invasiveness—for applications in electrochemical interfaces and particularly in neural recording/stimulating applications.

A preferred method for fabricating a Pt nanorod electrode array sensor device includes forming planar metal electrodes on a flexible film, co-depositing Pt alloy on the planar metal electrodes via physical vapor deposition, and dealloying the Pt alloy to etch Pt nanorods from the deposited Pt alloy. The other metal is one that can be selectively etched after deposition of the bimetal alloy. A preferred Pt alloy is PtAg. The metal planar metal electrodes can comprise Pt or the alloying metal, e.g. Ag.

The method can include coating a carrier substrate with an anti-adhesion layer, depositing the flexible film on the anti-adhesion layer, patterning the flexible film for the planar metal electrodes and electrode leads, depositing the planar metal electrodes and electrode leads, depositing an adhesion layer on the planar metal electrodes, conducting the co-depositing of the Pt alloy, and conducting the dealloying the Pt alloy. The de-alloying can be an immersion in acid that selectively etches an alloyed metal with Pt in the deposited Pt alloy.

The method can also include passivating electrode and electrode lead areas with a passivation layer, depositing an anti-adhesion layer on the passivation layer, depositing a sacrificial layer on the anti-adhesion layer, selectively etching the passivation layer over electrode sites to expose the electrode sites with Pt nanorods, peeling the sacrificial layer, and peeling the flexible film from the carrier substrate.

A preferred Pt nanorod electrode sensor device includes a plurality of porous Pt nanorods on a planar metal electrode forming a sensor electrode. The planar metal electrode is on a flexible substrate. An electrode lead on the flexible substrate extends away from the planar metal electrode. Insulation is around porous Pt nanorods an upon the electrode lead. The Pt nanorods can be crystalline Pt. A preferred flexible substrate is parylene C, with a preferred thickness of ~2-20 µm.

A preferred sensor device has a charge injection capacity (CIC) of 4.4 mC/cm$^2$. The Pt nanorods can have a height in the range of 300-400 nm, or in the range of a few tens of nanometers to a few micrometers. The sensor electrode can have a charge storage capacity of ~51.6 mC/cm$^2$.

Preferred embodiments of the invention will now be discussed with respect to the drawings. The drawings may include schematic representations, which will be understood by artisans in view of the general knowledge in the art and the description that follows. Features may be exaggerated in the FIGS. 1A-1C show a preferred porous platinum electrode array 100 of three PtNR microelectrodes. The array 100 includes a Cr/Au film (conductive layers) though other combinations of an adhesion metal layer (e.g. Ti) and highly conductive layer (e.g. Pt) or other single or multiple metal layers 102, a Pt/Cr adhesion layer (with Cr being optional and can be replaced with Ti or other layers and Pt top layer is preferred for an epitaxial interface with the PtNRs formed on top; metal replacements can also be used) 104 on top of the substrate 102, the PtNRs film 106 on top of the adhesion layer 104 and parylene C layers or other inert thin polymer layers 108, passivating the device surface and opening the electrodes surface and measurement pads. The Cr/Au conductive films 102 have a typical thickness of ~100-150 nm and adhesion Cr/Pt layers 104 have a typical thickness of 200 nm~300 nm. These thicknesses can be adjusted based on device design considerations. The thickness of PtNRs film 106 can vary within 100 nm up to 2 µm, to tailor the electrode impedance and charge capacity depending on geometrical restrictions and the application requirements. The electrode diameter (including an array of Pt nanorods) 110 and the contact side-to-side spacing 112 can differ from micron to millimeter scale depending on application. For example, the electrode diameter can be as small as a 100 nm comprised only one PtNR or 1 mm comprised of hundreds of millions of PtNRs; each PtNR has a diameter of ~50-100 nm; the diameter of the PtNR can be further adjusted in the range of 1 nm-1 µm depending on the deposition conditions which determine the alloy composition and finally the amount of the selectively etched metal. The passivation parylene C layers 108 have a thickness of ~0.5-3 µm. FIG. 1B and FIG. 1C illustrate how the microelectrode probe 120 is electrically conducted from PtNR surface 121, to Pt/Cr adhesion layers 122, Au/Cr metal leads 123, and peripheral Au metal pads 124. Metal leads 123 are covered by passivation parylene C layer 125 to prevent signal cross-talk between adjacent electrodes. The metal contacts/leads, 121, 122, 123, and 124 are preferably patterned by photolithography but could be also be patterned by other techniques including electron-beam lithography, nano-imprint lithography, electron beam lithography, etc.

Figure 2B:
Figure 2C:
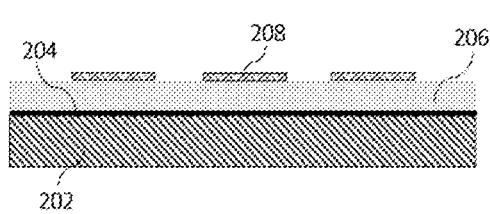
Figure 2D:
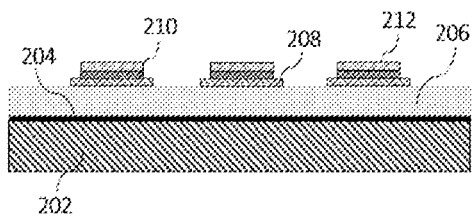
Figure 2E:
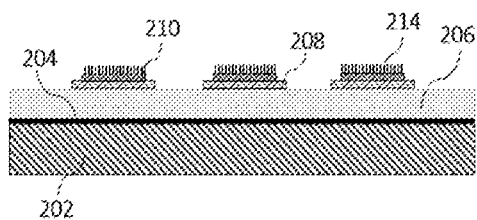
Figure 2F:
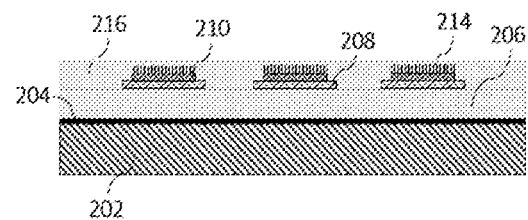
Figure 2G:
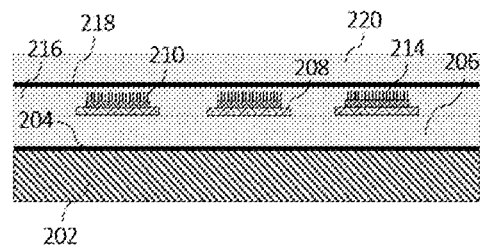
Figure 2H:
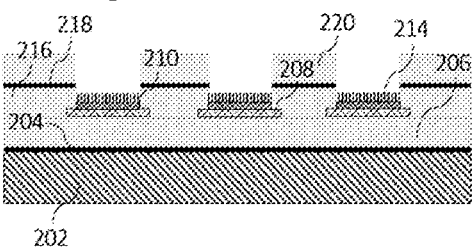
Figure 2I:
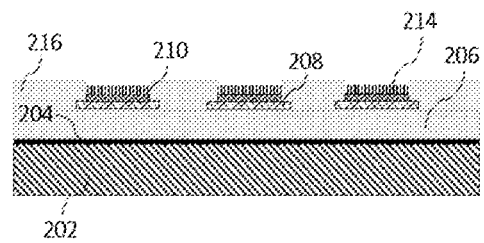
Figure 2J:
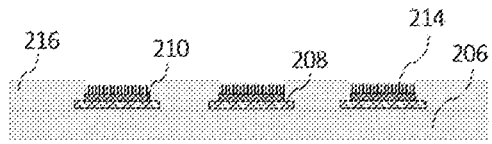

FIGS. 2A-2J illustrate the array 100 as it is fabricated. In FIG. 2A, a Si wafer 202, as carrier substrate although other substrates than Si can also be used, is first solvent cleaned and then diluted Micro-90 (0.1%)—then an anti-adhesion layer 204—is spun-cast on the Si substrate 202 to facilitate the separation of the device from the carrier substrate after device completion. Then the first parylene C layer 206 is deposited on Si substrate 202 as shown in FIG. 2B. Next, Au/Cr or other metal(s) lead/electrode sites 208 (FIG. 2C) are deposited and defined by lithography and deposited using standard metal deposition techniques. Next, the adhesion layer Pt/Cr or other metal(s) 210 is sputtered on Si substrate 202; followed by PtAg alloy deposition (co-sputtering) 212 and subsequent patterning of adhesion layer 210 and PtAg alloy 212 on top of electrode sites 208 through a standard lithography and lift off processes as illustrated in FIG. 2D. The co-sputtered PtAg alloy 212 can be de-alloyed by selective etching of the Ag metal. A typical dealloying process is composed of an immersion step in 60 C° Nitric acid for 2 min though these conditions can be further optimized. For example, higher temperatures would require lower etching time and so on. This selective etching process results in PtNRs film 214 on top of electrode sites 208, as depicted in FIG. 2E. Then, all metallic patterns 208, 210, 212 are passivated through deposition of second encapsulation parylene C layer 216, with the first parylene C carrier substrate 206 being activated by oxygen plasma to increase the adhesion in between coated parylene C layers 206, 216, displayed in FIG. 2F. In the next step, shown in FIG. 2G, an anti-adhesion layer (Micro-90) or another similarly purposed sacrificial layer 218 was spun-cast on the second parylene C layer 216, to facilitate the detachment of a sacrificial parylene C layer 220 that is deposited on top of 218. The objective of $3^{rd}$ parylene C layer 220 is to protect the passivation layer during the following plasma etching step. To expose the PtNRs films 214, in FIG. 2H, the $2^{nd}$ and $3^{rd}$ paryelene C layers 216, 220 are selectively etched only on top of electrode sites 208, using oxygen plasma, where the rest of parylene C layers 216, 220 are protected by patterned etch mask layer such as an SU-8 resist that we used as a hard mask. Then, the sacrificial parylene C layer 220 is mechanically peeled-off by washing away the anti-adhesion layer (Micro-90) 218 in DI water, leaving behind the PtNR films 214 and intact $2^{nd}$ passivation parylene C layer 216 as the only top exposed materials. Finally, $1^{st}$ and $2^{nd}$ parylene C layers 206, 216 together are mechanically peeled-off (FIG. 2J) from the Si substrate 202, by immersing in DI, water the dissolves the Micro-90 layers between layers 206 (parylene C) and 202 (Si substrates) as well as any Micro-90 residue from the PtNRs and parylene C surface.

Figure 3:
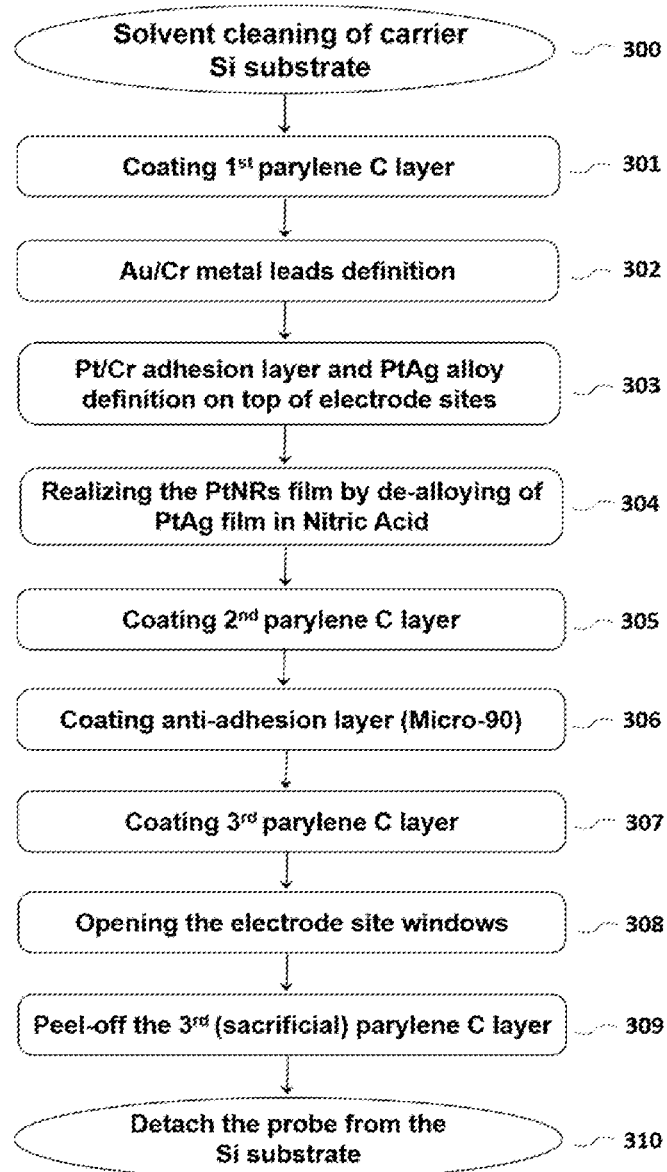
FIG. 3 shows process flow steps used in FIGS. 2A-2J.

FIG. 3 summarizes the preferred fabrication process flow. The first parylene C layer is deposited on solvent cleaned Si substrate 300 for the first step 301. Then the Au/Cr metal leads are patterned 302 followed by Pt/Cr adhesion layer and PtAg alloy patterning and deposition on top of electrode 303. Next, the dealloying of PtAg alloy in 60° C. nitric acid will be performed to realize PtNRs film in the step 304. Passivation layer coating ($2^{nd}$ parylene C) 305 is deposited next which is then followed by anti-adhesion layer (Micro-90) coating in the step 306. Then, sacrificial parylene C layer is deposited in step 307, where etching the parylene layers on top of electrode sites 308 and mechanical detachment of sacrificial parylene C layer 309 are performed next. Finally, the electrode will be mechanically peeled-off in step 310 from Si substrate 300, by immersing in DI water.

Experiments demonstrated a preferred method to conduct physical vapor deposition of Pt on a Pt blanket surface and then form nanorods by chemical etching in a process referred to as dealloying that left highly-stable Pt nanorods standing on the planar Pt electrodes. Electrochemical aspects were qualified in bench-top testing and we observed that they exhibit low electrochemical impedances at low frequency recordings, important for measuring brain activity in a frequency regime typically used in brain-machine interfaces (high gamma power). Also they provide additional performance gain at high frequency regimes for recording single units from cortical surfaces.

In the example experiments to demonstrate fabrication consistent with FIGS. 2A-3, Si wafers were used as substrate carriers for the thin parylene C layers. The Si wafers are first solvent cleaned by rinsing with acetone/isopropanol (IPA)/deionized (DI) water/IPA, then are subjected to ultrasonic agitation in IPA for 5 min, and are rinsed again with acetone/IPA/DI water/IPA. Diluted Micro-90 (0.1%), an anti-adhesion layer, is spun-cast at 1500 rpm on the Si wafer to facilitate the separation of the device after the device fabrication completed. A first parylene C layer ($\approx$1.9-2.5 µm) is deposited by chemical vapor deposition using a PDS 2010 Parylene coater system. Metal lead patterns are defined and exposed using a Karl Suss MA6 mask aligner using NR9-3000 negative resist. Temescal BJD 1800 electron beam evaporator is used for the deposition of 15 nm Cr adhesion layer and 100 nm Au contact layer, and a lift-off process in acetone follows. Then patterns of the electrode sites are defined using NR9-6000 negative resist and a Karl Suss MA6 mask aligner for exposure. A 15 nm/100 nm Cr/Pt layer is sputtered followed by deposition of ~0.5 µm thick AuAg alloy using a co-sputtering technique performed at 400 W (RF) and 50 W (DC) powers for co-deposition of Ag and Pt, respectively. A lift-off process in acetone follows shortly after. To realize PtNR film on electrode sites, de-alloying (chemical etching) is performed (for example in Nitric acid at 60 C° for 2 min). $O_2$ plasma (Oxford Plasmalab 80 RIE) is then applied (e.g., for 2 min (150 W RF power)) to activate the surface of parylene C for enhancing the adhesion of the subsequent encapsulating parylene C layer. A layer of $\approx$1.9-2.5 µm parylene C is then deposited and followed by coating another Micro 90 anti-adhesion layer. This time, a slightly higher concentrated Micro-90 (1% as opposed to 0.1% for the first layer) is spun-cast at 650 rpm for 10 s on this second parylene C layer for ease of separation of the subsequent layers. A third parylene C layer is then deposited to serve as a protector film for passivation layer during etching the electrode sites opening. Then a thick SU-8 2010 photoresist is spun-cast and patterned, which is exposed and developed with SU-8 developer. $O_2$ plasma is used to etch the openings in the third and second parylene C layers. The third parylene C layer is then mechanically peeled off in all regions, resulting in exposure of fresh passivation layer ($2^{nd}$ PXC layer) and PtNR contacts as only interface materials. Finally, the device is immersed in DI water for detachment from the Si wafer by washing away the Micro-90 anti-adhesion layer in between $1^{st}$ parylene and Si wafer. The device is then interfaced to external circuitry by conventional means such as bonding to anisotropic conductive film (ACF) and commercial off the shelf ribbon cables.

Measured PtNR impedance is as low as ion-permeable organic PEDOT:PSS [8] at 1 kHz and is lower at 10 Hz, for all contact sizes. At 10 Hz, the magnitude of the impedance at 20 µm is 3.5MΩ for PtNRs, 4.6MΩ for PEDOT:PSS, and 43MΩ for planar Pt and that of 2 mm is 1.6 kΩ for PtNRs, 1.3 kΩ for PEDOT:PSS, and 13.7 kΩ for planar Pt. At 1 kHz, the magnitude of the impedance is 76.5 kΩ for PtNRs, 64 kΩ for PEDOT:PSS, and 796 kΩ for planar Pt and that of 2 mm is 1.4 kΩ for PtNRs, 1.5 kΩ for PEDOT:PSS, and 1.6 kΩ for planar Pt. The significant low PtNR electrochemical impedance from commonly used metal contacts, allow the electrode contact size to be scaled down without compromising their impedance. That demonstrates the feasibility of micro-sized electrodes fabrication, made of conventional materials, while maintaining their impedance at low values comparable to those of larger electrodes in macro-scale. The process uniformity is illustrated with a very narrow distribution of the impedances of PtNR micro-electrodes (D=50 µm), in contrast to Pt micro-contacts with a broader distribution of 1 kHz/10 Hz impedances. For a 56 microelectrode array with 50 µm diameter per site, the average magnitude of the electrode impedance at 10 Hz for PtNRs are relatively uniform (0.670±0.025 MΩ) compared to planar Pt microelectrodes (8.95±2.1 MΩ). Similarly, at 1 kHz, the average magnitude of the electrode impedance for PtNRs is uniform (16.89±0.47 kΩ) and is lower than the more variable impedances (153.01±24 kΩ) of similar-diameter Pt microelectrodes Under biphasic current injection, the PtNR electrodes exhibit smaller voltage transients than conventional Pt electrodes and therefore lower power requirement. Therefore, higher currents could be safely injected without raising the potential at the microcontact surface to the water hydrolysis potential, thereby permitting higher charge injection capacity (CIC). At an electrode diameter of 20 µm, the CIC values are 4.4 mC/cm$^2$ for PtNRs compared to 0.27 mC/cm$^2$ for planar Pt (cathodic limited with a pulse width of 650 µs). As expected, larger contacts permit the injection of larger currents but not all the surface area in larger contacts contributes to the reversible charge injection. This limits the charge density and decreases CIC for larger contacts, as we previously systematically validated for a number of contact material systems. [Ref. 9]. For the same diameter of 20 µm microcontact, CIC of PtNR is 4.4 mC/cm$^2$, which is ~16 times larger than that of Pt (0.27 mC/cm$^{-2}$) where the planar Pt surface has been activated for ion-adsorption by cyclic voltammetry. The PtNR CIC is also ~3.3 times larger than that of PEDOT:PSS (CIC=1.34 mC/cm$^2$). The measured CIC of PtNRs is among the highest charge injection capacities that is reported to date such as activated and sputtered Iridium oxide (IrOx) [Ref. 12, 13], which is reported to be 1-5 mC/cm$^2$ and well above the values conventionally used in large surface area neuromodulation devices (30 µC/cm$^2$). The power required to inject the same charge density for PtNRs at 20 µm diameter is 23% that of activated planar Pt, which significantly reduces the power budget and size of the control electronics and increases the battery lifetime for semichronic and chronic implants. This high performance and yield for PtNR microelectrodes is expected to improve the efficacy and the outcome of the surgical procedure. The last metric relevant to stimulation is the charge storage capacity (CSC), associated with total amount of charge available for a stimulation pulse, which depends on different electrochemical and physical properties such as the geometrical area and the roughness of the electrode surface. Measured CV for 30 µm diameter Pt and PtNR electrode materials indicates PtNR shows ~6 times larger CSC (51.6 mC/cm$^2$) compared to that of Pt microcontact (8.9 mC/cm$^2$).

Figure 4A:
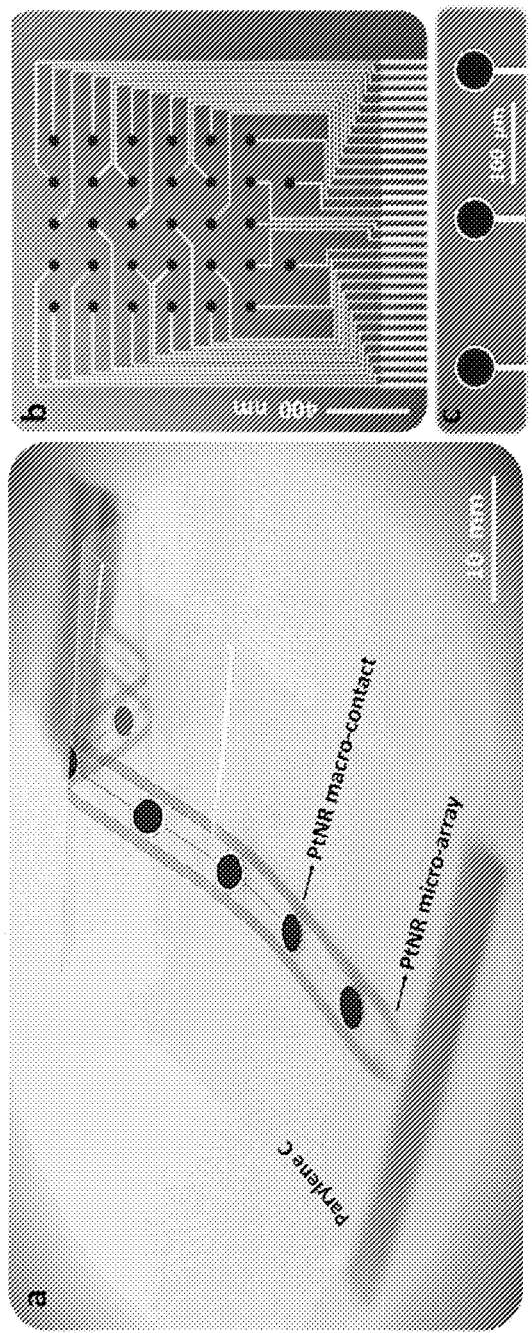
FIGS. 4A-4E are images of an experimental flexible sensor device of the invention.
Figure 4B:
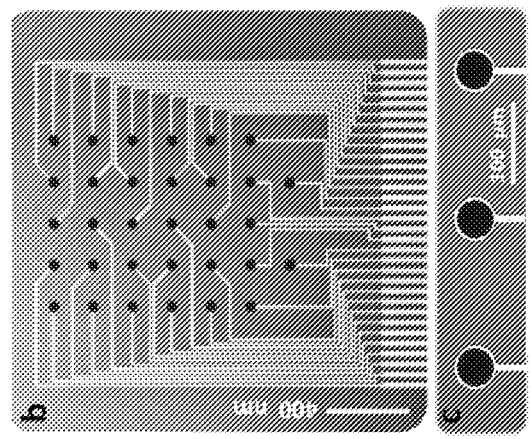
Figure 4C:
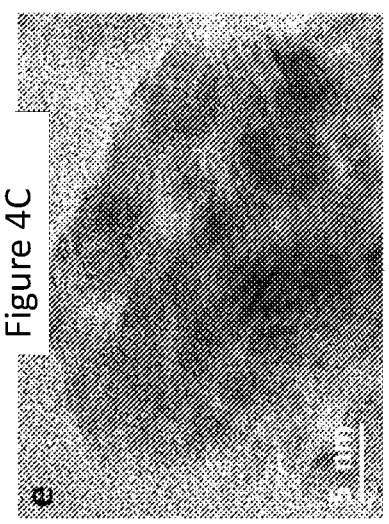
Figure 4D:
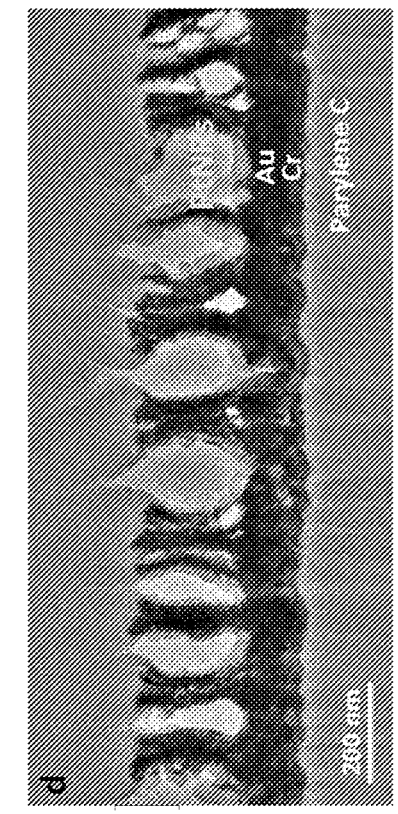
Figure 4E:
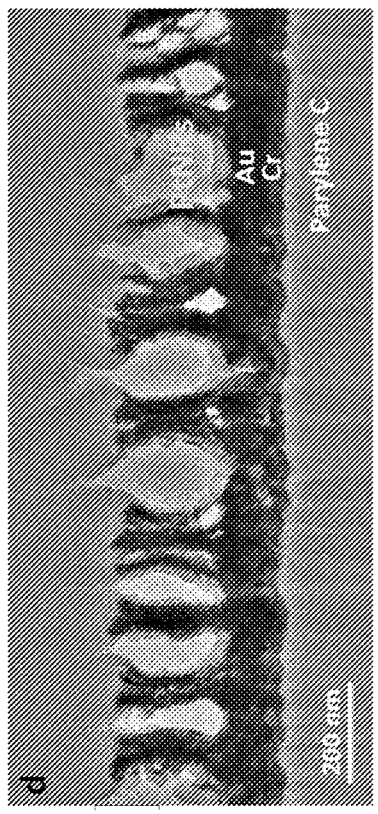

FIG. 4A shows a picture of the fabricated electrophysiology PtNR device on thin film parylene C layer, showing the location of microarrays with 56 microdots at the top of the probe and above the 6 macro REF electrodes. Top view optical images of FIG. 4B, a PtNR array with 32 microelectrodes and FIG. 4C, a local view 3×1 PtNR microelectrode (D=50 µm) array. FIG. 4D shows cross-sectional TEM image at the sliced PtNR micro-electrode, showing stacked metal layers; highlighting intimate contact between the different layers of the device. FIG. 4E is a high-resolution TEM image at one of the PtNR tip.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for fabricating a Pt nanorod electrode array sensor device, comprising:
    forming planar metal electrodes on a flexible film;
    co-depositing Pt alloy on the planar metal electrodes via physical vapor deposition;
    dealloying the Pt alloy to etch Pt nanorods from the deposited Pt alloy.

2. The method of claim 1, wherein the Pt alloy comprises PtAg.

3. The method of claim 2, wherein the planar metal electrodes comprise Pt.

4. The method of claim 2, wherein the planar metal electrodes comprise Ag.

5. The method of claim 1, comprising:
    coating a carrier substrate with a first anti-adhesion layer; depositing the flexible film on the first anti-adhesion layer; patterning the flexible film for the planar metal electrodes and electrode leads; depositing the planar metal electrodes and electrode leads; depositing an adhesion layer on the planar metal electrodes; conducting the co-depositing of the Pt alloy; and conducting the dealloying the Pt alloy.

6. The method of claim 5, wherein the de-alloying comprises an immersion in acid that selectively etches an alloyed metal with Pt in the deposited Pt alloy.

7. The method of claim 5, further comprising: passivating electrode and electrode lead areas with a passivation layer; depositing a second anti-adhesion layer on the passivation layer; depositing a sacrificial layer on the second anti-adhesion layer; selectively etching the passivation layer over electrode sites to expose the electrode sites with Pt nanorods; peeling the sacrificial layer; peeling the flexible film from the carrier substrate.

8. The method of claim 1, wherein the Pt alloy comprises Pt with another metal that can be selectively etched after deposition of the Pt alloy.

* * * * *